United States Patent
Lai et al.

(10) Patent No.: US 9,471,167 B2
(45) Date of Patent: Oct. 18, 2016

(54) ORGANIC LIGHT-EMITTING DIODE TOUCH DISPLAY PANEL

(71) Applicant: EverDisplay Optronics (Shanghai) Limited, Shanghai (CN)

(72) Inventors: PingHsu Lai, Shanghai (CN); HsiaoYi Lin, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 25 days.

(21) Appl. No.: 14/596,963

(22) Filed: Jan. 14, 2015

(65) Prior Publication Data

US 2016/0041667 A1   Feb. 11, 2016

(30) Foreign Application Priority Data

Aug. 6, 2014 (CN) .......................... 2014 1 0382449

(51) Int. Cl.
| G06F 3/041 | (2006.01) |
| H01L 27/32 | (2006.01) |
| H01L 51/52 | (2006.01) |
| G09G 3/32 | (2016.01) |

(52) U.S. Cl.
CPC ........... *G06F 3/0412* (2013.01); *H01L 27/323* (2013.01); *H01L 27/3211* (2013.01); *H01L 51/5281* (2013.01); *G09G 3/3208* (2013.01)

(58) Field of Classification Search
USPC ....... 345/92, 173, 174, 175, 690, 76, 7, 211, 345/80, 207
See application file for complete search history.

(56) References Cited

U.S. PATENT DOCUMENTS

| | | | |
|---|---|---|---|
| 2008/0030491 A1* | 2/2008 | Kim ...................... | G06F 1/3203 345/207 |
| 2008/0055212 A1* | 3/2008 | Kim .................... | H01L 27/3276 345/80 |
| 2008/0084377 A1* | 4/2008 | Tateuchi .............. | G09G 3/3648 345/92 |
| 2009/0002268 A1* | 1/2009 | Ueta ...................... | B60K 35/00 345/7 |
| 2010/0013745 A1* | 1/2010 | Kim ...................... | G06F 3/0412 345/76 |
| 2010/0123671 A1* | 5/2010 | Lee ........................ | G01L 1/16 345/173 |
| 2010/0259563 A1* | 10/2010 | Tokuda ................ | G09G 3/2014 345/690 |
| 2011/0032209 A1* | 2/2011 | Kim ........................ | G06F 3/044 345/174 |
| 2012/0013590 A1* | 1/2012 | Minami ............... | G09G 3/3225 345/211 |
| 2012/0256973 A1* | 10/2012 | Choi ................... | H01L 51/5253 345/690 |
| 2013/0147764 A1* | 6/2013 | Chaji ................... | H01L 27/3227 345/175 |
| 2014/0015764 A1* | 1/2014 | Arola ...................... | G06F 3/041 345/173 |
| 2014/0225938 A1* | 8/2014 | Soni ...................... | G09G 3/3233 345/690 |
| 2015/0091849 A1* | 4/2015 | Ludden ................ | G06F 3/0412 345/174 |
| 2015/0169011 A1* | 6/2015 | Bibl ....................... | G06F 3/0412 345/175 |
| 2015/0268754 A1* | 9/2015 | Chang .................. | G09G 3/3413 345/175 |

* cited by examiner

*Primary Examiner* — Thuy Pardo
(74) *Attorney, Agent, or Firm* — Wang Law Firm, Inc.

(57) ABSTRACT

An OLED touch display panel includes a pixel layer having red subpixels, green subpixels, and blue subpixels. The red subpixels, the green subpixels, and the blue subpixels are arranged in a repeated manner. An encapsulation glass is mounted on the pixel layer. A touch sensor pattern layer is formed on the encapsulation glass and is aligned with gaps between the red subpixels, the green subpixels, and the blue subpixels. In another aspect, an OLED touch display panel includes a pixel layer having subpixels of different colors. An encapsulation glass is mounted on the pixel layer in a first direction. A polarizer is mounted on the encapsulation glass in the first direction. A touch sensor pattern layer is mounted between the encapsulation glass and the polarizer. At least a portion of spacing sections between the subpixels overlaps a pattern of the touch sensor pattern layer in the first direction.

13 Claims, 3 Drawing Sheets

ORGANIC LIGHT-EMITTING DIODE TOUCH DISPLAY PANEL

BACKGROUND OF THE INVENTION

The present invention relates to a touch display panel and, more particularly, to an organic light-emitting diode (OLED) touch display panel.

The development of techniques of the ouch panel industry becomes more and more faster, and the structure evolves from G/G double-layer glass to single glass plate, including one glass solution (OGS), Touch on Lens, In-cell, On-cell, etc. Application of thin-film technique (G/G or G/F/F) also receives attention. Thus, there are many main streams in the touch control field. Currently, touch panels are mainly used in devices having a smaller screen, such as smart phones and tablet computers. All-in-one machines and large-size notebooks have also begun to use touch panels. Current touch-control conductive materials are not suitable for large-size screens, because more data have to be processed if the screen size is increased, and the demand of the impedance is increased accordingly. Use of indium tin oxide (ITO) is limited when the screen is larger than 14 inches. Thus, substitute materials, such as metal meshes, nanosilver (silver nanoparticles), carbon nanotubes, and graphene, are valued. Metal meshes and nanosilver are more mature and are substitute materials that are more likely to be mass-produced at present time.

FIGS. 1-4 show diagrammatic structures of three conventional display panels. FIG. 1 is a diagrammatic view of a structure of a first conventional display panel without a touch control sensor. FIG. 2 is a diagrammatic view of a structure of a second conventional display panel with an ITO touch control sensor 94. As can be seen from FIG. 3, the display panel of FIG. 2 includes, from top to bottom, a cover glass 91, an optically clear adhesive (OCA) 92, a polarizer 93, an ITO touch control sensor 94, and a thin-film-transistor liquid-crystal display (TFT-LCD) module 95. The TFT-LCD includes a color filter glass 96, a pixel layer 97, and a backlight glass 98. As can be seen from FIG. 3, the ITO touch control sensor 94 covers the whole pixel layer 97 and, thus, adversely affects the optical performance. If it is desired to improve the optical performance, the thickness of the ITO touch control sensor 94 must be increased, which leads to a change in the resistance. Thus, the touch control method of the display panel of FIG. 2 does not permit easy control of the resistance. FIG. 4 is a diagrammatic view of a third conventional display panel with a metal mesh sensor 99. As can be seen from FIG. 4, the metal mesh sensor 99 is external and also covers the whole pixel layer. The luminance of the color is reduced, because the light is blocked by the metal mesh. Furthermore, an interference pattern is generated due to blockage by the metal mesh.

BRIEF SUMMARY OF THE INVENTION

In view of the above disadvantages, the present invention provides, in an aspect, an organic light-emitting diode (OLED) touch display panel including a pixel layer having a plurality of red subpixels, a plurality of green subpixels, and a plurality of blue subpixels. The plurality of red subpixels, the plurality of green subpixels, and the plurality of blue subpixels are arranged in a repeated manner. An encapsulation glass is mounted on the pixel layer. A touch sensor pattern layer is formed on the encapsulation glass and is aligned with gaps between the plurality of red subpixels, the plurality of green subpixels, and the plurality of blue subpixels.

The organic light-emitting diode touch display panel can further include a polarizer mounted on the encapsulation glass.

The touch sensor pattern layer can be a molybdenum mesh.

The organic light-emitting diode touch display panel can further include a plurality of pixel defining layers mounted between the plurality of red subpixels, the plurality of green subpixels, and the plurality of blue subpixels.

In another aspect, the present invention provides an organic light-emitting diode (OLED) touch display panel including a pixel layer having a plurality of subpixels. The plurality of subpixels is spaced from each other by a plurality of spacing sections. The plurality of subpixels has different colors. An encapsulation glass is mounted on the pixel layer in a first direction. A polarizer is mounted on the encapsulation glass in the first direction. A touch sensor pattern layer is mounted between the encapsulation glass and the polarizer. The touch sensor pattern layer includes a pattern. At least a portion of the plurality of spacing sections between the plurality of subpixels overlaps the pattern of the touch sensor pattern layer in the first direction.

In an example, the pattern of the touch sensor pattern layer does not overlap the plurality of subpixels in the first direction.

In an example, the plurality of spacing sections includes a plurality of pixel defining layers.

The touch sensor pattern layer can be a molybdenum mesh.

The plurality of subpixels can include a plurality of red subpixels, a plurality of green subpixels, and a plurality of blue subpixels.

The organic light-emitting diode touch display panel can further include an optically clear adhesive layer mounted on the polarizer in the first direction. Furthermore, a cover glass is mounted on the optically clear adhesive layer in the first direction.

The present invention will become clearer in light of the following detailed description of illustrative embodiments of this invention described in connection with the drawings.

DETAILED DESCRIPTION OF THE INVENTION

An organic light-emitting diode (OLED) touch display panel according to the present invention includes a pixel layer including a plurality of subpixels. The subpixels are spaced from each other by a plurality of spacing sections.

The subpixels have different colors. Preferably, the subpixels at least include a plurality of red subpixels, a plurality of green subpixels, and a plurality of blue subpixels. An encapsulation glass is mounted on the pixel layer in a first direction. A polarizer is mounted on the encapsulation glass in the first direction. A touch sensor pattern layer is mounted between the encapsulation glass and the polarizer. The touch sensor pattern layer includes a pattern. At least a portion of the spacing sections between the subpixels overlaps the pattern of the touch sensor pattern layer in the first direction.

Preferably, the pattern of the touch sensor pattern layer does not overlap the subpixels in the first direction. Preferably, the spacing sections include a plurality of pixel defining layers. Preferably, the touch sensor pattern layer is a molybdenum mesh.

Figure 1:
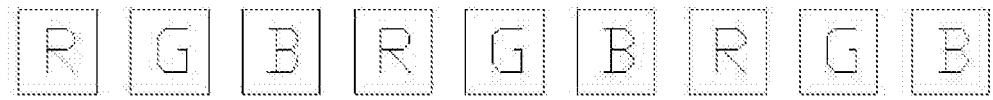
FIG. 1 is a diagrammatic view of a structure of a first conventional display panel.
Figure 2:
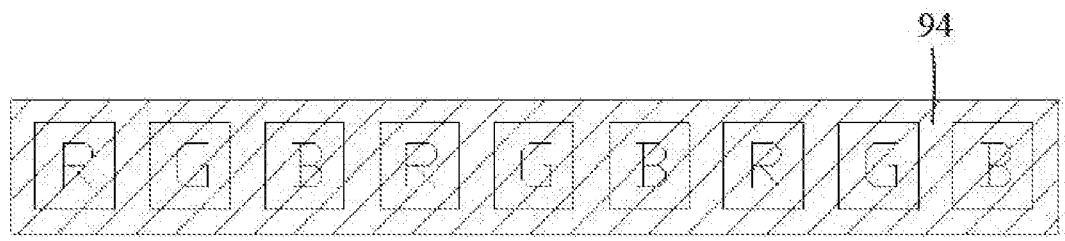
FIG. 2 is a diagrammatic view of a structure of a second conventional display panel.
Figure 3:
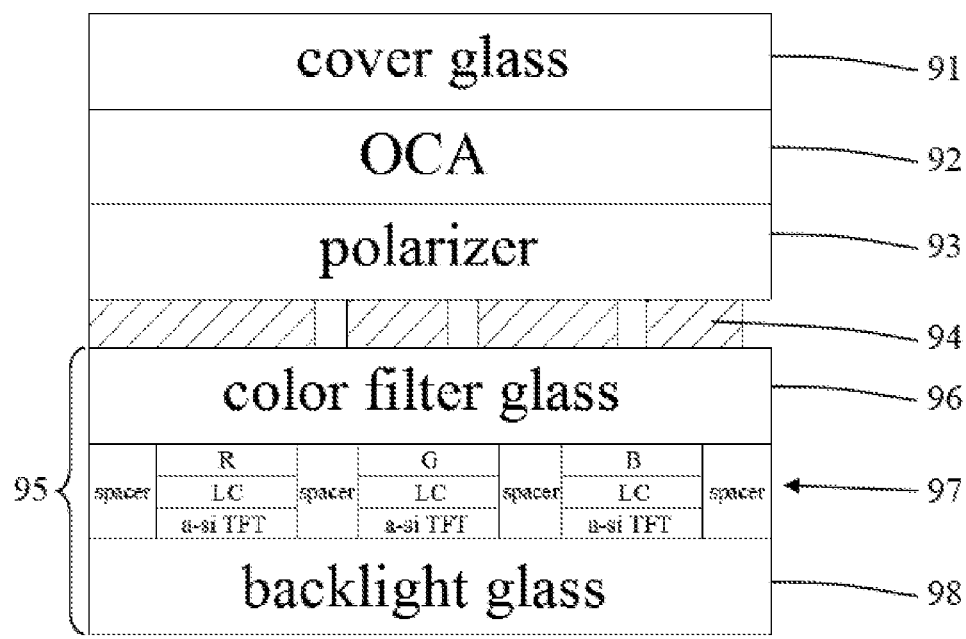
FIG. 3 is a diagrammatic view of the whole conventional panel of FIG. 2.
Figure 4:
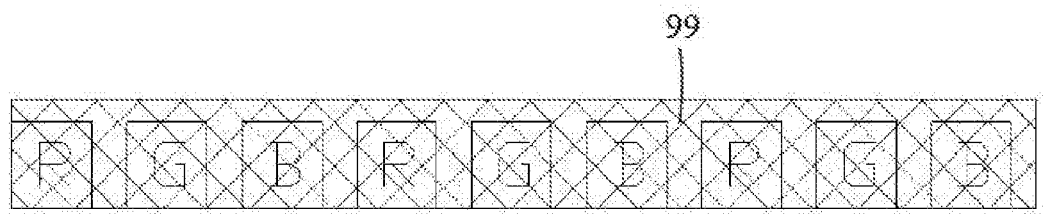
FIG. 4 is a diagrammatic view of a third conventional display panel.
Figure 5:
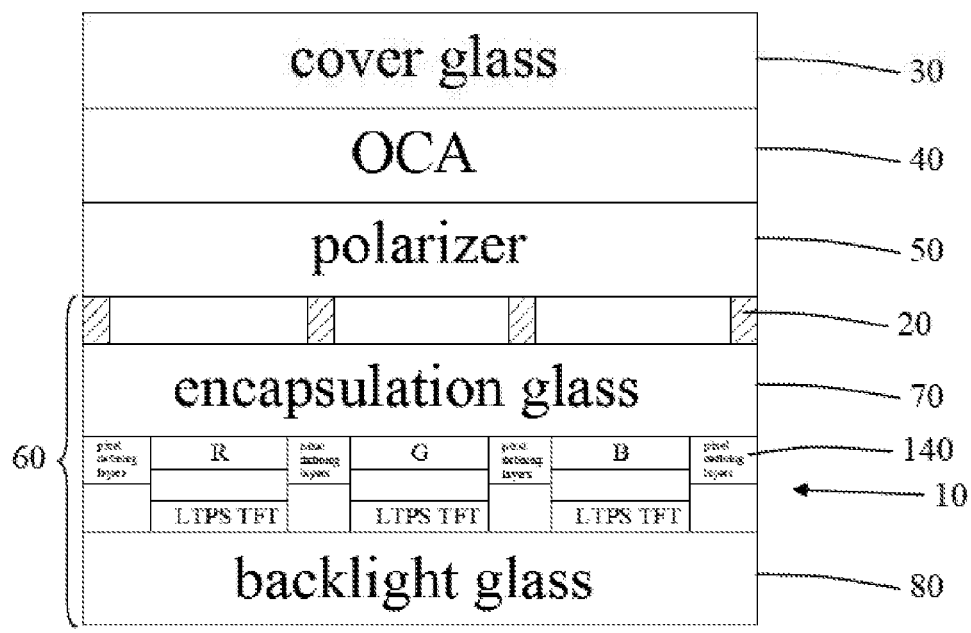
FIG. 5 is a diagrammatic view of an OLED touch display panel according to the present invention.
Figure 6:
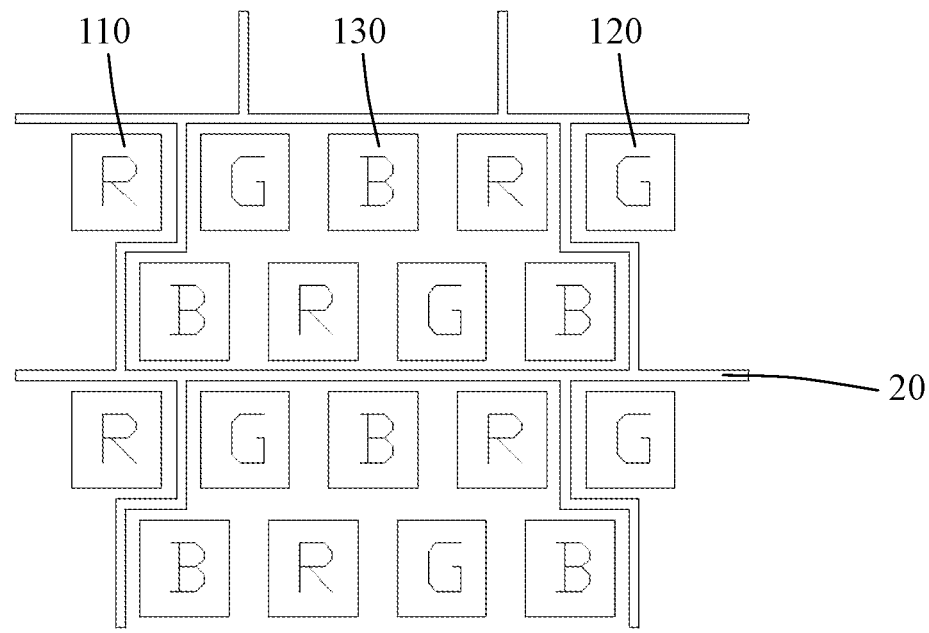
FIG. 6 shows a first example of the OLED touch display panel according to the present invention.

The present invention will be described in details in connection with the accompanying drawings and illustrative embodiments. With reference to FIG. 5, the OLED touch display panel according to the present invention includes a pixel layer 10 having a plurality of red subpixels 110, a plurality of green subpixels 120, and a plurality of blue subpixels 130. The red subpixels 110, the green subpixels 120, and the blue subpixels 130 are arranged in a repeated manner. An encapsulation glass 70 is mounted on the pixel layer 10. With reference to FIG. 6, a touch sensor pattern layer 20 is formed on the encapsulation glass 70 and is aligned with gaps between the red subpixels 110, the green subpixels 120, and the blue subpixels 130. Preferably, the touch sensor pattern layer 20 is a molybdenum mesh to provide a low impedance and high penetration.

By integrating the touch sensor pattern layer 20 with the encapsulation glass 70, the OLED touch display panel according to the preferred embodiment does not have to include a touch control panel. The touch sensor pattern layer 20 does not overlap areas where the pixels are arranged and, thus, will not block the light. Since the areas where the pixels are arranged are not blocked, brightness of emitted lights of different colors from the pixels is even clearer when compared with the conventional sensor arrangement.

With reference to FIGS. 5 and 6, specifically, the OLED touch display panel according to the preferred embodiment of the present invention includes a cover glass 30, a seal, i.e. an optically clear adhesive layer 40, a polarizer 50, and an OLED module 60. The OLED module 60 further includes an encapsulation glass 70, a touch sensor pattern layer 20, a pixel layer 10, and a backlight glass 80. A plurality of pixel defining layers 140 is mounted between the red subpixels 110, the green subpixels 120, and the blue subpixels 130. The polarizer 50 is mounted on the encapsulation glass 70. The polarizer 50 shields reflection from the metal at the lower layer, effectively reducing ambient light reflected through the touch sensor pattern layer 20 and, hence, reducing the risk of high reflection of the touch sensor pattern layer 20.

Figure 7:
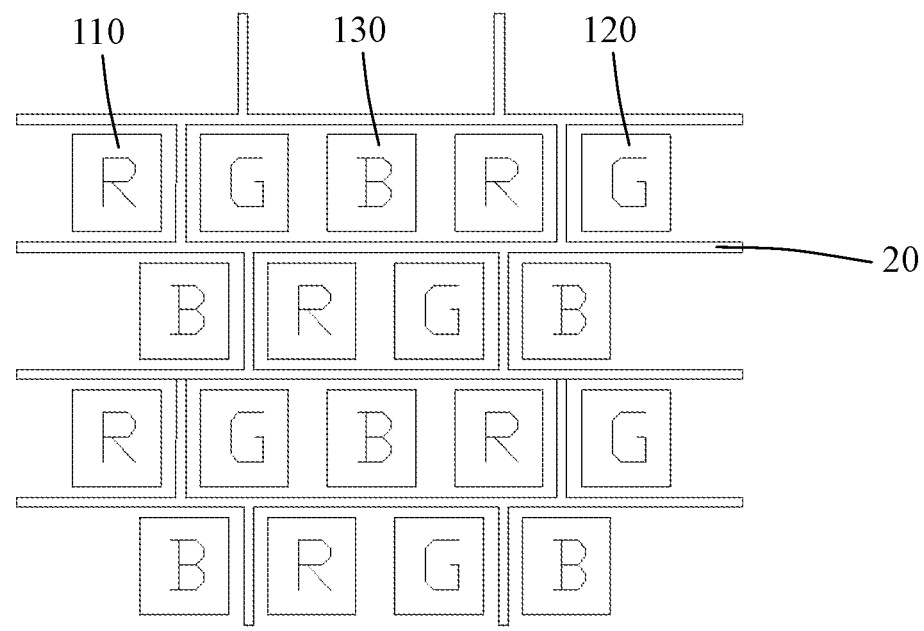
FIG. 7 shows a second example of the OLED touch display panel according to the present invention.

FIG. 7 shows a second example of the OLED touch display panel according to the preferred embodiment of the present invention. Compared to the example of FIG. 6, location of the touch sensor pattern layer 20 located in gaps defined between any two adjacent subpixels, e.g. the red subpixels 110, the green subpixels 120, and the blue subpixels 130. It is to be noted from the accompanying drawing that the location of the touch sensor pattern layer 20 may also be located among three adjacent subpixels. As a result of this arrangement of the touch sensor pattern layer 20, the location of the touch sensor pattern layer 20 is located between at least two adjacent subpixels. Thus, the sections of the pattern of the touch sensor pattern layers 20 are interconnected to form a large area of conductive wire to reduce the impedance, increasing the utility of touch chips.

Although specific embodiments have been illustrated and described, numerous modifications and variations are still possible without departing from the scope of the invention. The scope of the invention is limited by the accompanying claims.

The invention claimed is:

1. A display panel comprising:
    a pixel layer including a plurality of subpixels;
    a plurality of pixel defining layers, each pixel defining layer separating two adjacent subpixels, each pixel defining layer having a first width;
    an encapsulation glass disposed above the pixel layer; and
    a plurality of touch sensor pattern layers disposed on the encapsulation glass, each touch sensor pattern layer having a second width, the second width being smaller than the first width, each touch sensor pattern layer being aligned with a pixel defining layer.

2. The display panel as claimed in claim 1 further comprising a polarizer mounted on the encapsulation glass.

3. The display panel as claimed in claim 1, wherein the touch sensor pattern layer is a molybdenum mesh.

4. The display panel as claimed in claim 1, wherein the subpixels are red subpixels, green subpixels, and blue subpixels.

5. The display panel as claimed in claim 1, wherein the touch sensor pattern is located among three adjacent subpixels.

6. An organic light-emitting diode touch display panel comprising:
    a pixel layer including a plurality of subpixels, with the plurality of subpixels spaced from each other by a plurality of spacing sections, with the plurality of subpixels having different colors;
    an encapsulation glass mounted on the pixel layer in a first direction;
    a polarizer mounted on the encapsulation glass in the first direction; and
    a touch sensor pattern layer mounted between the encapsulation glass and the polarizer, with the touch sensor pattern layer including a pattern, wherein at least a portion of the plurality of spacing sections between the plurality of subpixels overlaps the pattern of the touch sensor pattern layer in the first direction.

7. The organic light-emitting diode touch display panel according to claim 6, wherein the pattern of the touch sensor pattern layer does not overlap the plurality of subpixels in the first direction.

8. The organic light-emitting diode touch display panel according to claim 6, wherein the plurality of spacing sections includes a plurality of pixel defining layers.

9. The organic light-emitting diode touch display panel according to claim 7, wherein the plurality of spacing sections includes a plurality of pixel defining layers.

10. The organic light-emitting diode touch display panel according to claim 6, wherein the touch sensor pattern layer is a molybdenum mesh.

11. The organic light-emitting diode touch display panel according to claim 6, wherein the plurality of subpixels includes a plurality of red subpixels, a plurality of green subpixels, and a plurality of blue subpixels.

12. The organic light-emitting diode touch display panel according to claim 6, further comprising:
    an optically clear adhesive layer mounted on the polarizer in the first direction; and a cover glass mounted on the optically clear adhesive layer in the first direction.

13. The organic light-emitting diode touch display panel according to claim 7, further comprising:
  an optically clear adhesive layer mounted on the polarizer 5 in the first direction; and
  a cover glass mounted on the optically clear adhesive layer in the first direction.

\* \* \* \* \*